(12) United States Patent
Jolley et al.

(10) Patent No.: US 6,819,450 B1
(45) Date of Patent: Nov. 16, 2004

(54) ENHANCED EDGE RESOLUTION AND CRITICAL DIMENSION LINEARITY IN LITHOGRAPHY

(75) Inventors: Matthew J. Jolley, Beaverton, OR (US); Jerry Martyniuk, Portland, OR (US); H. Christopher Hamaker, Portland, OR (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/538,848

(22) Filed: Mar. 28, 2000

(51) Int. Cl.[7] .............................................. G06K 15/00
(52) U.S. Cl. .................. 358/1.8; 358/1.9; 358/3.01; 358/3.24; 347/253; 347/254
(58) Field of Search ................ 358/1.1–1.9, 1.11–1.18, 358/296, 3.01, 3.24; 430/199, 296, 942; 250/492.2; 347/224, 225, 236, 238, 239, 252, 253, 254, 255, 240, 251

(56) References Cited

U.S. PATENT DOCUMENTS

| | | | |
|---|---|---|---|
| 4,264,711 A | 4/1981 | Greeneich | 430/296 |
| 4,806,921 A | 2/1989 | Goodman et al. | 340/747 |
| 4,879,605 A | * 11/1989 | Warkentin et al. | 358/296 |
| 5,103,101 A | 4/1992 | Berglund et al. | 250/492.2 |
| 5,386,221 A | 1/1995 | Allen et al. | 346/108 |
| 5,393,987 A | * 2/1995 | Abboud et al. | 250/492.22 |
| 5,533,170 A | 7/1996 | Teitzel et al. | 395/108 |

* cited by examiner

Primary Examiner—King Y. Poon
(74) Attorney, Agent, or Firm—Shirley L. Church

(57) ABSTRACT

A semiconductor fabrication gray level photolithography strategy, in which the energy beam intensities corresponding to each gray level are selected from a set of non-linear, non-monotonic intensities. Rasterized geometric shape edges are defined by associating one or more intermediate gray levels with pixels in at least one row of pixels. The geometric shape is printed or imaged on an energy sensitive layer by modulating an energy beam to the intensity corresponding to the associated gray level, and directing the modulated beam to the pixel location on the layer. The intensities corresponding to the gray levels are selected so as to optimize critical dimension (CD) characteristics and other printing features.

13 Claims, 13 Drawing Sheets

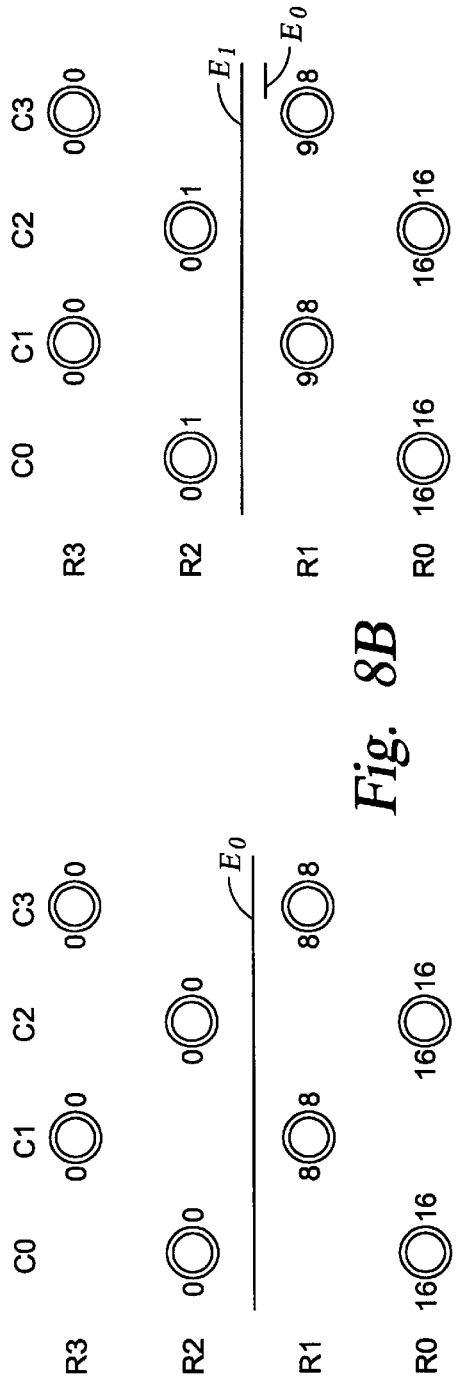
Fig. 8A
Fig. 8C
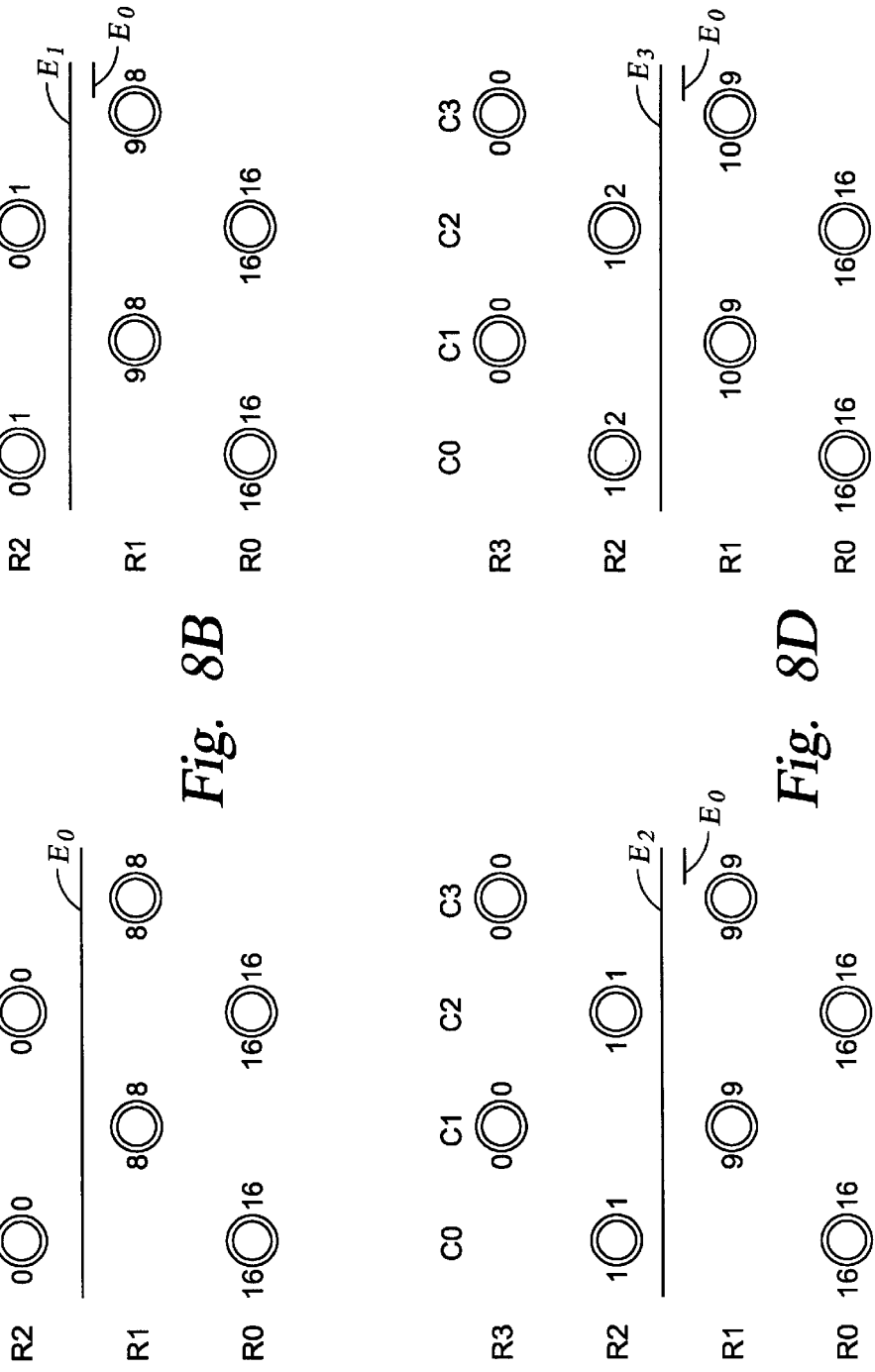
Fig. 8B
Fig. 8D

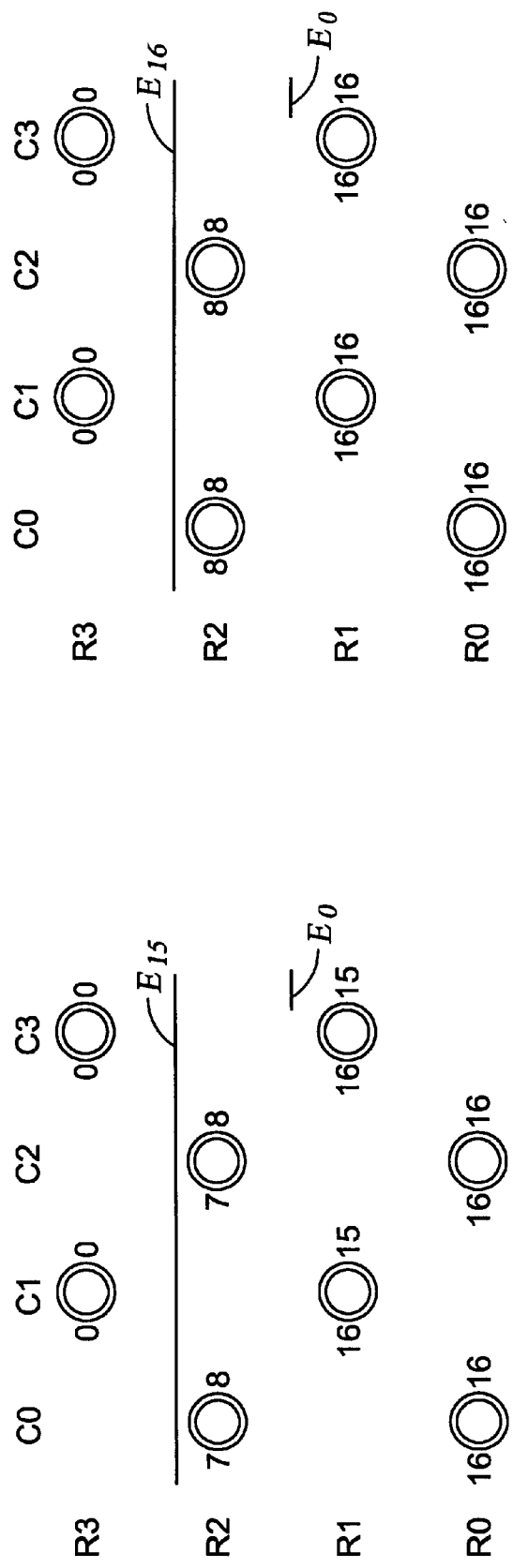

ENHANCED EDGE RESOLUTION AND CRITICAL DIMENSION LINEARITY IN LITHOGRAPHY

BACKGROUND

1. Field of Invention

The invention relates to photolithography, and more particularly to gray scale photolithography used to define edges on microelectronic device patterns during integrated circuit fabrication.

2. Related Art

Photolithography is used in semiconductor integrated circuit fabrication. Direct writing photolithography is typically used to define reticle mask patterns subsequently employed during projected image photolithography printing on the integrated circuit wafer. In direct writing (two-step) lithography strategies, radiated energy, such as laser or electron beams, is directed in a controlled manner on to an energy sensitive layer (e.g., a photoresistive layer or "resist") overlying a substrate. The energy beams expose a pattern in the energy sensitive layer which, depending on the composition of the energy sensitive layer, becomes more soluble (positive resist) or less soluble (negative resist) in a chemical developer solution. The amount of accumulated energy from one or more beams incident on a location determines the exposure amount.

The pattern to be printed is typically defined in an orthogonal array of picture elements (pixels) oriented in X (rows) and Y (columns). Thus each pixel in the array has a unique address location. A pattern is defined by exposing selected pixels in a single array, or by exposing selected pixels in two or more overlapping and/or interstitial arrays. The distance between two adjacent pixels in an array is the pixel pitch.

In some conventional printing (imaging or writing) strategies, each pixel receives either the maximum beam energy or no beam energy. In enhanced printing strategies each pixel may receive one of several intermediate (between zero and maximum) "gray level" beam energy levels (intensities or doses). In a typical gray level strategy, each gray level number represents a corresponding beam intensity that is linearly proportional to the gray level number. For example, in a gray level printing strategy using seventeen gray levels (0–16), gray level number 1 represents one-sixteenth of the maximum beam energy, gray level number 2 represents two-sixteenths of the maximum beam energy, etc. Thus the intensities corresponding to the gray level numbers linearly increase in proportion to the gray level numbers.

A typical beam energy cross section is approximately gaussian. Maximum energy per unit area occurs at the pixel center and decays with distance from the center. It is therefore helpful to consider a pixel as a particular target location rather than a defined area. To ensure proper energy sensitive layer exposure, pixels are positioned so that the energy each pixel receives from the energy beam overlaps other pixels. Thus the total accumulated energy a particular pixel receives is often the sum of beam energy directed at the particular pixel and beam energies directed at nearby pixels. When a lithographic tool exposes the energy sensitive layer by irradiating a pixel array, the edge of a printed geometric pattern is defined by the total energy received at each pixel.

FIG. 1 illustrates total energy received from an incident beam along a column of pixels 10. The number adjacent each of the six pixels shown represents the gray level number in a strategy using, for example, 17 gray levels. Immediately above column 10 is a graph plotting energy incident at each pixel against position. As discussed above, individual energy curves 12 represent the gaussian energy cross section each of the column 10 pixels receives from the incident beam. Note that the curve representing gray level number 8 is one-half the maximum gray level number 16. No energy is incident on pixels with gray level number 0 (zero). Curve 14 is the sum of curves 12 and represents the total accumulated energy cross section received by the energy sensitive layer. Curve 14 is normalized to have 1.0 as double the intensity required to fully clear the energy sensitive layer.

Persons skilled in the art will understand that assigning various gray level numbers to pixels, and thus changing the associated energy dose directed to corresponding pixels, moves the edge position. In this way small incremental changes are made to edge positions when printing small geometric shapes. By one definition, an edge of an object to be printed occurs at 0.5 on the normalized scale described above. In this model, the slope is steepest at the 0.5 dose, thereby giving the smallest change in critical dimension (CD) or size of the feature per percent dose change. In actual practice, the maximum exposure energy used is often greater or less than the optimal dose to clear because the dose is used to make features larger or smaller. This action sacrifices CD uniformity, however, because systematic and random dose errors will generate larger CD errors than the optimal dose to clear. In FIG. 1, edge position 18 is shown corresponding to the position of the pixel assigned gray level number 8.

The effective grid is the grid on which pattern edges may be defined. Using multiple exposures (printing passes) and/or gray levels per pixel per exposure, the smallest effective grid of the pattern being printed that can be resolved is the pixel pitch divided by the product of the number of exposures and the number of non-zero intensity levels per exposure (assuming typically linear values for intensity levels are fixed for all exposures). On a multiple exposure printing system, such as an Etec Systems, Inc. ALTA 3500, successive exposures may have the center of the pixels shifted in X and Y. In such multiple exposure systems, the effective pixel pitch after one or more exposures would be the distance between the pixel centers. When the dominant distribution of energy per pixel spot size at half power is from 2 to 4 times wider than the effective pixel pitch, pattern edges can be defined at the desired effective grid positions.

FIG. 2 illustrates one gray level scheme similar to that used in an Etec Systems, Inc. CORE 2564 lithography tool in a single exposure, 16 non-zero gray levels per pixel mode to define the edge of an object to be printed. Alternatively, FIG. 2 illustrates, for example, one of 8 exposures made on an ALTA 3000. Numbers shown adjacent each pixel are illustrative and represent the gray level number assigned to the pixel. During printing, an energy dose corresponding to the gray level number is then directed at the pixel. In column 2A edge $E_0$ is centered on the row R1 pixel that is assigned gray level number 8, and consequently receives 0.5 (eight-sixteenths) of the normalized maximum dose. By increasing the row R1 gray level number by one, an action that correspondingly increases beam intensity, the edge is defined slightly higher at $E_1$, as shown in column 2B. The edge is moved in successive small increments by incrementing the row R1 pixel gray level number until the maximum (level 16) is reached. At that point, the row R2 pixel gray level numbers are incremented. Finally, as shown in column 2Q, edge $E_{16}$ is centered on the row R2 pixel that is assigned gray level number 8, and is displaced by one row from the row 2A position. Thus an edge is positioned between rows R1 and R2 in approximately 16 equal steps.

FIG. 3 illustrates another gray scale printing scheme used in the Etec Systems, Inc. ALTA family of lithography tools. The ALTA 3500 prints patterns using 16 non-zero gray levels per exposure, typically making 4 to 8 exposures to define a complete pattern. Each of the beam intensities associated with the 16 non-zero gray levels may be independently set in the ALTAs. The intensities are typically set in linear proportion to the gray levels. Between exposures the center of each pixel is shifted in X and Y. FIG. 3 illustrates edge placement in one dimension and without coordinate shifting for clarity.

As shown, the scheme uses 16 gray level numbers but moves the edge by alternately incrementing row R1 and row R2 gray level numbers. This is implemented on the ALTA by printing row R1 in one or more exposures and printing row R2 in one or more separate exposures. Thus each edge is defined by pixels in two adjacent rows having received an intermediate energy dose. As in column 2A (FIG. 2), in column 3A edge $E_0$ is centered on the row R1 pixel. In column 3B the row R2 pixel is incremented by one gray level number to define edge El slightly higher (one-sixteenth pixel pitch) than $E_0$. To move the edge another increment, the row R1 pixel gray level number is increased by one to define edge $E_2$ as shown in column 3C. The scheme alternately increments the row R1 and R2 pixels until edge $E_{16}$ is displaced from the edge $E_0$ position by the distance of a row (pixel pitch), as shown in column 3Q.

Rasterization is the process of converting pattern geometry into an array of pixels each at least one associated gray level number. FIG. 4 is a block diagram showing data path components 28 of a conventional lithography tool. Geometric data 30 contains information describing the pattern to be defined on work piece 32 (e.g., quartz glass covered with a layers of chromium and resist). Data path processor 34 sorts, merges, and transfers to rasterizer 36 the geometries so that different geometry lists can be independently rasterized in parallel for optimal printing. In the Etec Systems, Inc. CORE 2000/2564 systems, for example, the data path processor reformats geometries to a hardware rasterizer geometry instruction format. In the ALTA 3000/3500 systems, the data path processor reformats the geometries to a combined software and hardware instruction format. Rasterizer 36 includes geometry engines 38 and beam circuit boards 40. Geometry engines 38 receive rasterization parameters 42 and convert the geometric information from processor 34 to one or more pixel arrays with gray level numbers associated with each pixel. The pixel array information is passed to beam circuit boards 40 which, in turn, convert the gray level numbers to analog signals that drive accousto-optic modulator 44. Accordingly, gray level numbers associated with each pixel represent, based on parameters from calibrator 54, signals used to modulate one or more energy beams. Laser beam generator 45 directs laser beam 46 into beam splitter 47 that, in turn, creates a plurality (e.g., 32) of separate beams 48. Modulator 44 controls the intensity of each of energy beams 48. Calibrator 54 is coupled to beam boards 40 and is used to set the beam energy level intensity matching each gray level used in the particular printing scheme. Beams 48 are focused and directed by control mechanism 50 to be incident on resist layer 52 overlying work piece 32. Persons familiar with lithography tools will understand the details of both the data path as shown and of similar data paths.

Increasing microelectronic device miniaturization requires that ever-smaller features be printed, and with greater accuracy. Edges must be located as accurately and with as steep a slope as possible. But critical dimensions in present lithography schemes become increasingly nonlinear when submicron (below approximately 500 nanometers (nm)) features are printed. Enhancing edge resolution by increasing the energy dose applied to edge pixels is known, see e.g., U.S. Pat. No. 4,264,711 issued to Greeneich, but requires the data path to first determine edge location before determining an appropriate edge pixel dose. This requirement places an extra computational load on the data path, and requires existing data paths to be redesigned to perform the necessary computational tasks. What is desired is a way using existing system data path architecture to enhance edge resolution while maintaining critical dimension linearity when printing small features.

SUMMARY

In accordance with the invention, photolithography embodiments use a gray level printing process in which a conventional set of linearly increasing gray level numbers is defined (e.g., 0–16). A second set of energy beam intensities is defined so that a beam intensity corresponds to each unique gray level number. Unlike other printing strategies, however, the beam intensities are non-linear and non-monotonic in relation to the corresponding gray level numbers (e.g., the beam intensity increase between gray level numbers 2 and 3 may be different from the intensity increase between gray level numbers 3 and 4, and the intensity change between gray level numbers 15 and 16 may be a decrease). In some embodiments one or more beam intensities associated with intermediate gray level numbers are higher than the beam intensity associated with twice the dose to clear a large area on an energy sensitive layer (1.0 on the normalized intensity scale), thereby defining an having a steeper slope.

A geometric shape to be printed (imaged) on the energy sensitive layer is rasterized to produce an array having rows of pixels, and each pixel is associated with at least one gray level number. Printing may be accomplished using multiple printing passes. In some embodiments each printing pass exposes a unique pixel. In other embodiments two or more printing passes expose the same pixel. In some embodiments an edge of the shape is defined by associating intermediate gray level numbers with pixels in two or more rows.

BRIEF DESCRIPTION OF THE DRAWINGS

FIG. 5 is a diagram illustrating a multiple printing pass strategy.

FIG. 6 is a diagram illustrating an embodiment of a gray level assignment strategy combined with the printing strategy shown in FIG. 5.

FIG. 7 is a diagram illustrating a second multiple printing pass strategy.

FIG. 8 is a diagram illustrating a second embodiment of a gray level assignment strategy combined with the printing strategy shown in FIG. 7.

DETAILED DESCRIPTION

Figure 1:
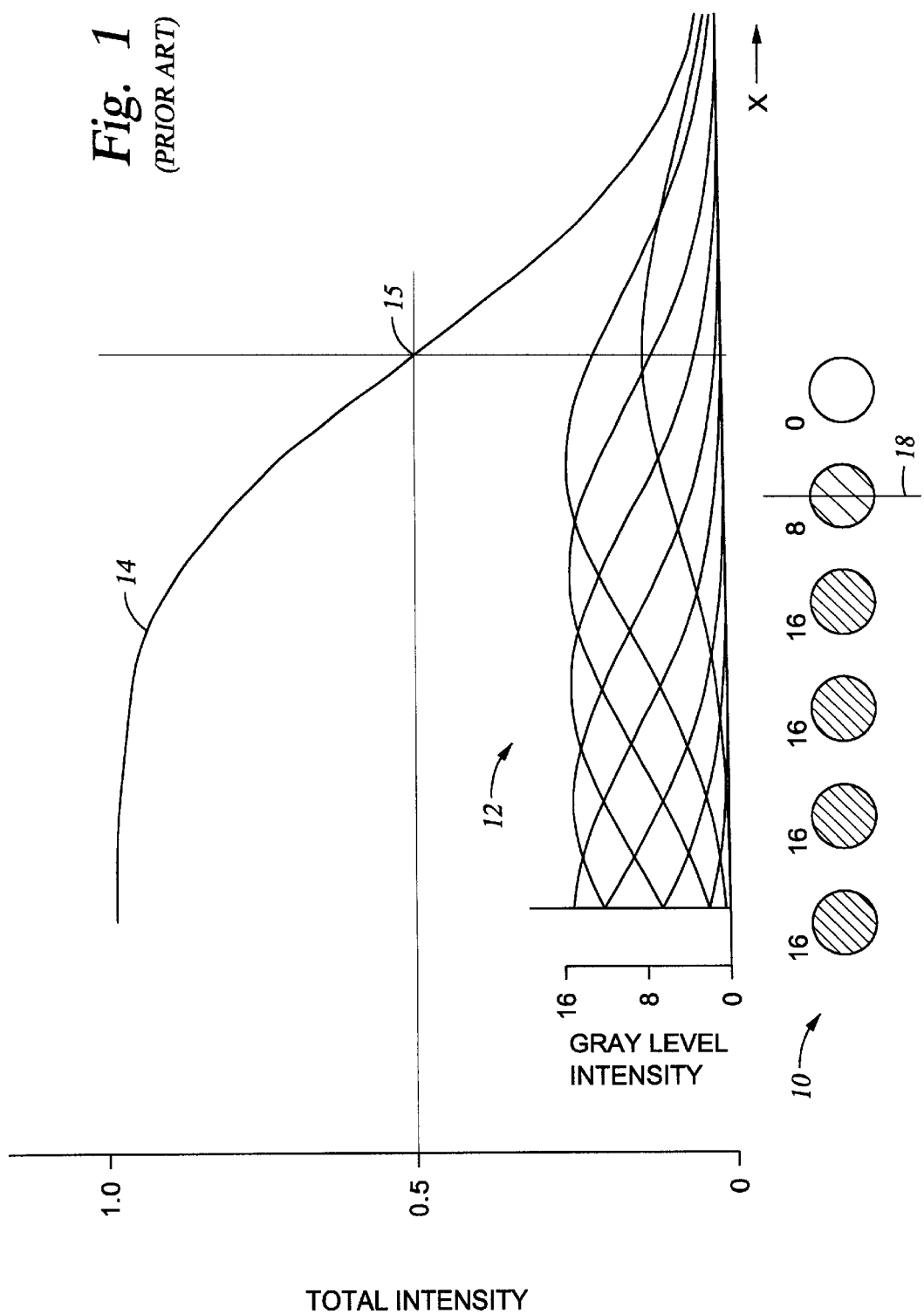
FIG. 1 illustrates total energy received from an incident beam along a column of pixels.
Figure 2:
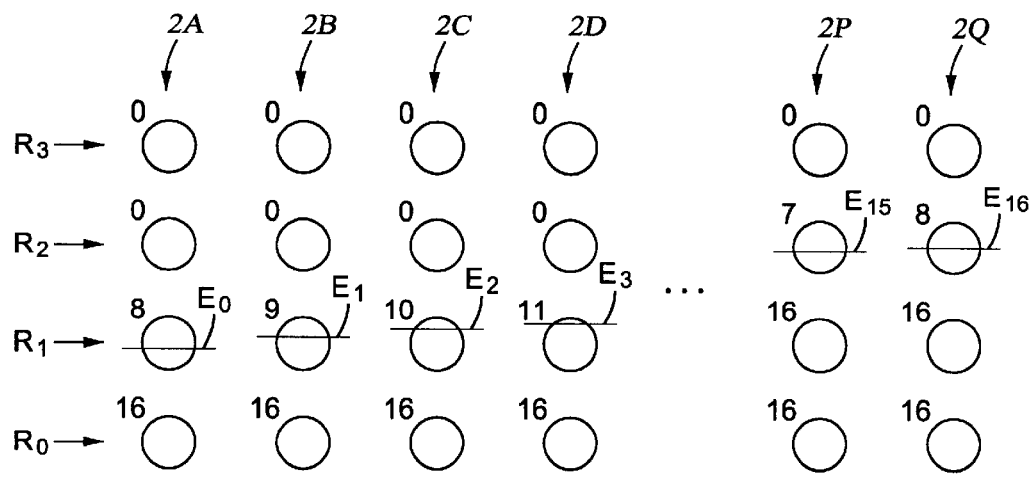
FIG. 2 shows one conventional gray level strategy used to define the edge of an object to be printed.
Figure 3:
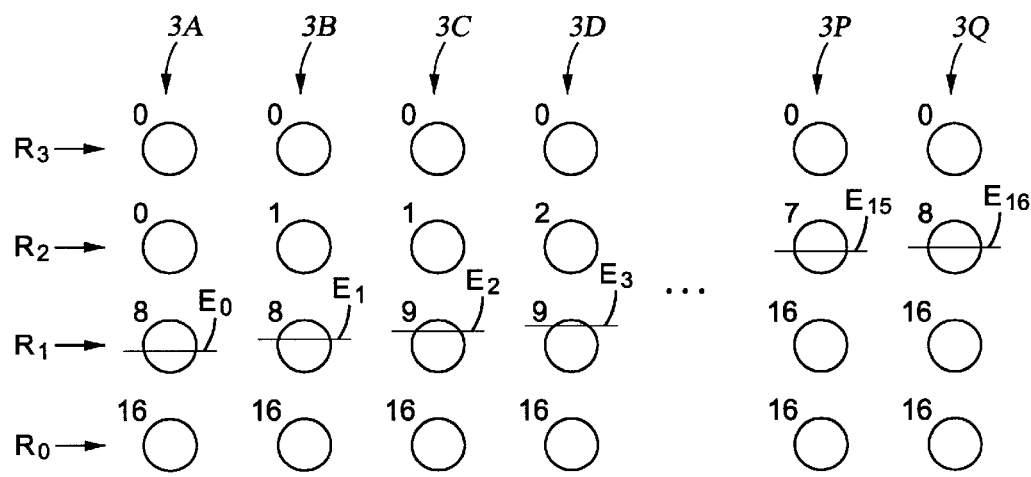
FIG. 3 shows a second conventional gray level strategy used to define the edge of an object to be printed.

References to rows and columns are illustrative, and persons skilled in the art will understand that edges may be defined in various orientations (e.g., horizontal and vertical).

Gray Level Number Assignments

FIGS. 5A–5D illustrate one embodiment defining an edge using a four-offset multipass exposure write methodology. A matrix of four rows R0–R3 and four columns C0–C3 is shown, representing an array of pixel locations 500 on, for example, a resist-coated reticle. Persons familiar with lithographic writing strategies will understand that the pixel matrix shown may be part of a conventional array or a conventional interstitial array. In one embodiment using an Etec Systems, Inc. ALTA 3500 lithography tool the single-pass (single exposure) pixel pitch is approximately 160 nanometers (nm). As depicted, a circle at a pixel represents that an energy dose (including a zero energy dose) has been applied at that pixel. As discussed above, beam energy directed at each pixel has a gaussian profile so that the size of the beam used with respect to the pixel spacing is chosen to create significant overlap of adjacent pixels so that interstices are quite evenly filled. In one embodiment the full-width half-maximum (FWHM) energy profile distance is approximately 290 nm. A number adjacent to the circle represents one of seventeen (0–16) gray level (e.g., modulating signal value) numbers assigned by the rasterizer to be applied at the pixel. Each gray level number is associated with an energy dose to be applied at a pixel location. The energy doses are described in more detail below. The circles and numbers as shown are purely illustrative.

Figures 5A, 5B, 5C, 5D:
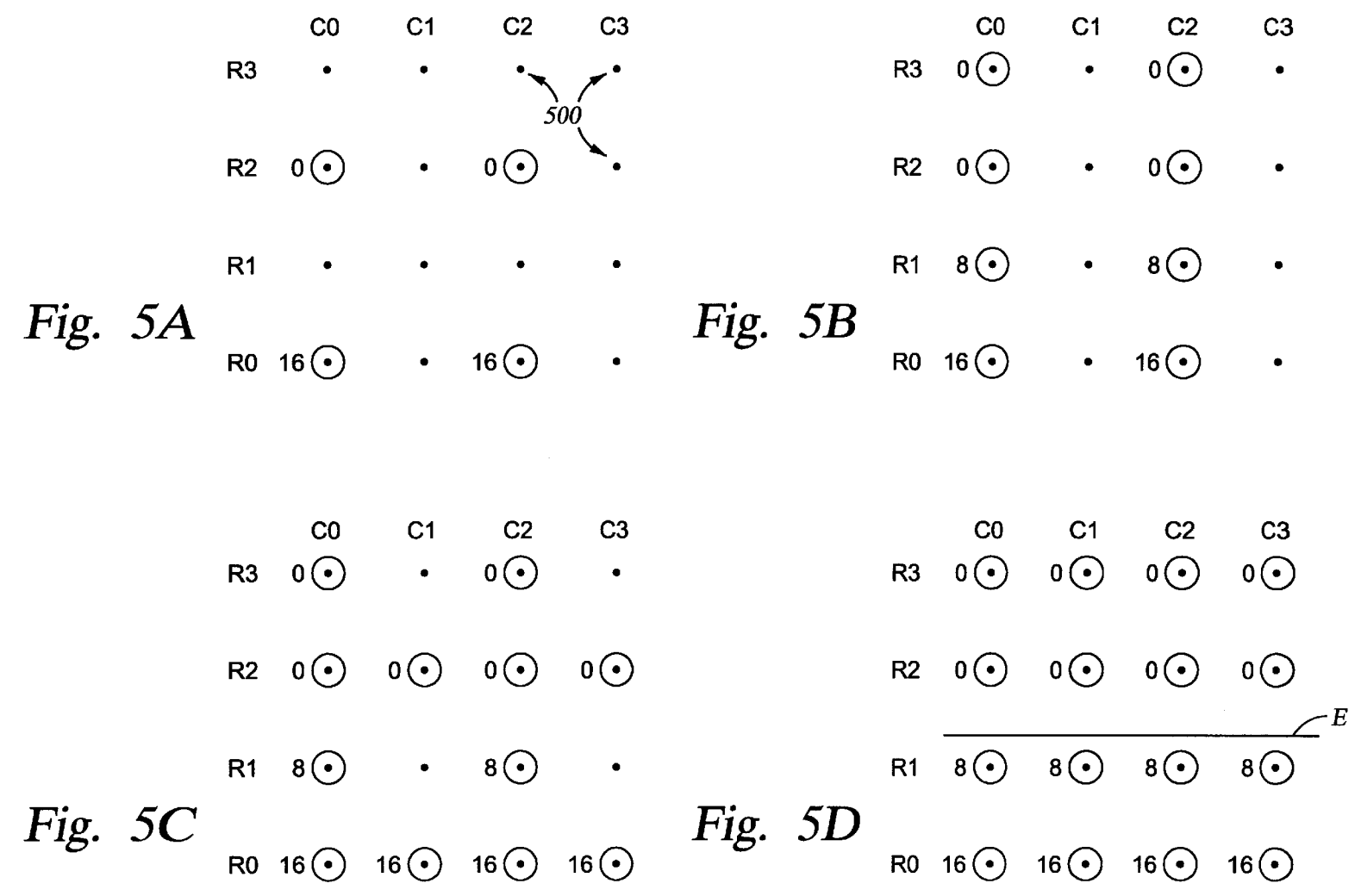

In FIG. 5A a first printing pass is performed applying energy doses associated with gray level 16 at (R0,C0) and (R0,C2), and with gray level 0 at (R2,C0) and (R2,C2). In FIG. 5B a second printing pass is performed applying energy doses associated with gray level 8 to (R1,C0) and (R1,C2), and with gray level 0 to (R3,C0) and (R3,C2). In FIG. 5C a third printing pass is performed applying energy doses associated with gray level 16 to (R0,C1) and (R0,C3), and with gray level 0 to (R2,C1) and (R2,C3). In FIG. 5D a fourth printing pass is performed applying energy doses associated with gray level 8 to (R1,C1) and (R1,C3), and with gray level 0 to (R3,C1) and (R3,C3). This printing scheme is similar to that used in the Etec Systems, Inc. model ALTA 3500, but persons familiar with beam lithography will understand that many printing scheme variations exist. FIG. 5D also shows that Edge E, aligned parallel to the pixel rows, is defined as a result of the energy doses applied during the four printing passes. Although gray level 8 is mid-way between levels 0 and 16, edge E is positioned between rows R1 and R2 because, as described below, the gray levels are calibrated to correspond to a set of non-linear, non-monotonic energy doses.

Figures 6A, 6B, 6C, 6D:
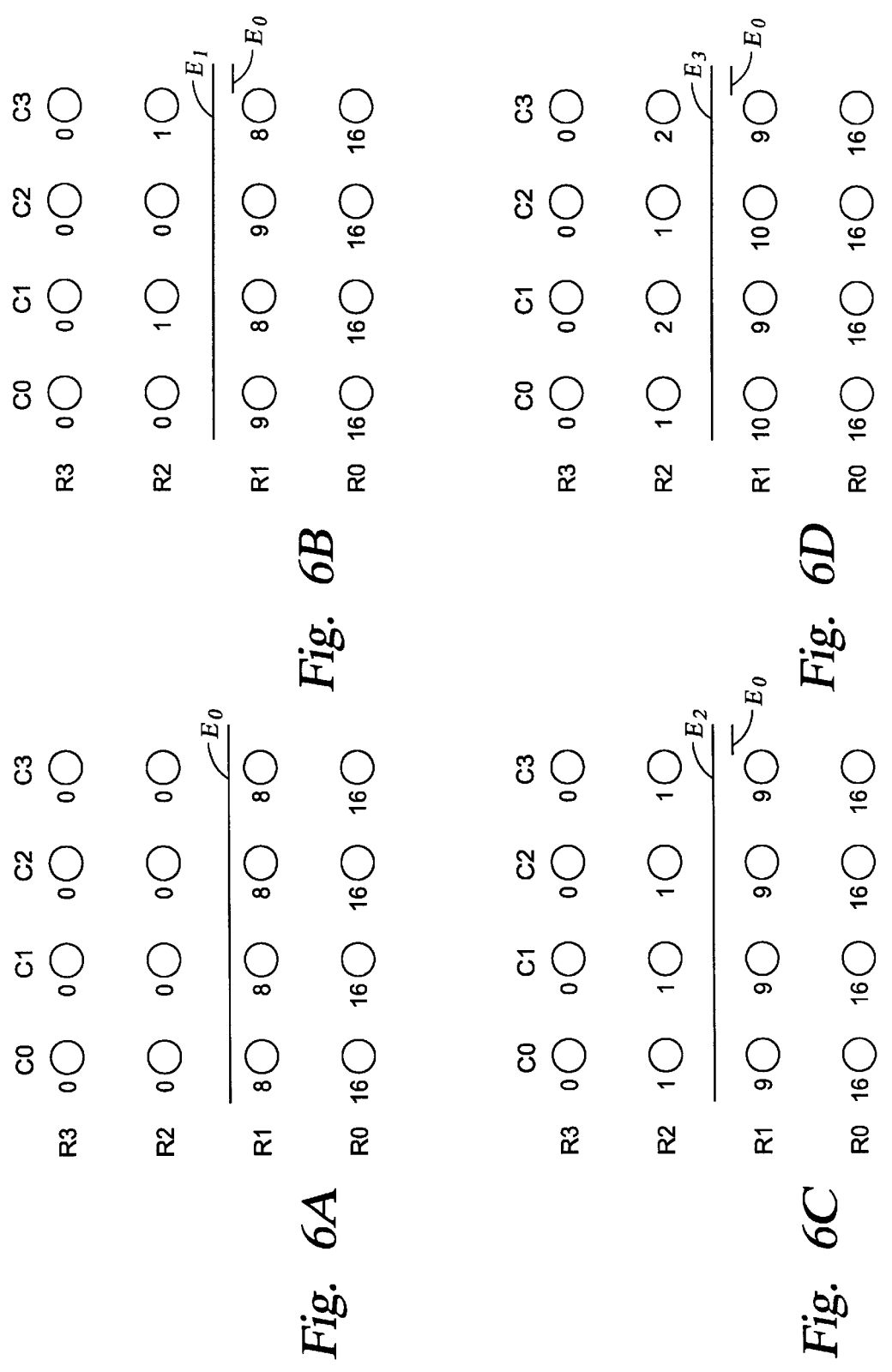

FIGS. 6A–6F illustrate various edge placements defined by gray levels associated with energy doses applied to adjacent rows after printing passes are complete. As shown, FIG. 6A is the same as FIG. 5D, defining edge $E_0$. The gray level assignment pattern in FIG. 6B varies from FIG. 6A by showing an energy dose corresponding to gray level 9 applied to (R1,C0) and (R1,C2), and with gray level 1 applied to (R2,C1) and (R2,C3). The change in total energy dose applied along rows R1 and R2 defines edge $E_1$ that is displaced from edge $E_0$ by approximately one-sixteenth (1/16) of the effective pitch between rows R1 and R2 (1/16 of 80 nm for the pixel placement pattern in this embodiment).

Figures 6E, 6F:
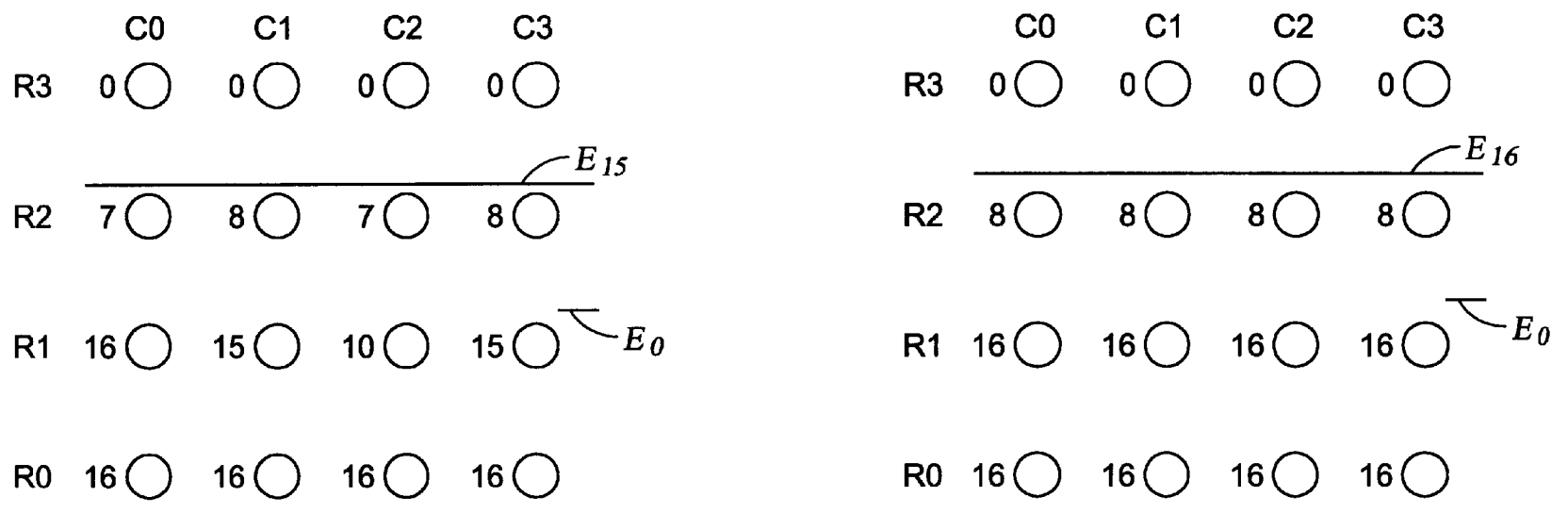

The pattern of incrementing the gray level numbers in adjacent rows is continued so as to define further sequential edge positions. FIG. 6C shows edge $E_2$ defined an additional one-sixteenth pixel pitch higher than the edge $E_1$ position. An energy dose associated with gray level 9 is applied to (R1,C0) and (R1,C2), and with gray level 1 to (R2,C0) and (R2,C2). Likewise, FIG. 6D shows an energy dose associated with gray level 10 applied to (R1,C0) and (R1,C2), and with gray level 2 applied to (R2,C1) and (R2,C3). The gray level incrementing pattern continues until, as shown in FIG. 6E, edge $E_{15}$ is defined by applying an energy dose associated with gray level 16 to (R1,C0) and (R1,C2), with gray level 15 to (R1,C1) and (R1,C3), with gray level 7 to (R2,C0) and (R2,C2), and with gray level 8 to (R2,C1) and (R2,C3). Finally, edge $E_{16}$ is defined one pixel pitch higher than edge $E_0$ by using the pixel gray level assignment pattern shown in FIG. 6A, but displaced upward by one row.

In some multipass printing strategies the pixels receive more than one dose. FIGS. 7A–7D illustrate one multipass printing strategy in which pixels receive two energy doses in separate passes. The concentric circles illustrate that two energy doses are applied to the same pixel. The number to the left of the pixel represents the gray level number assigned for the first exposure directed at that pixel, and the number to the right of the pixel represents the gray level number assigned for the second exposure directed at that pixel. The concentric circles and numbers shown are purely illustrative.

Figures 7A, 7B, 7C, 7D:
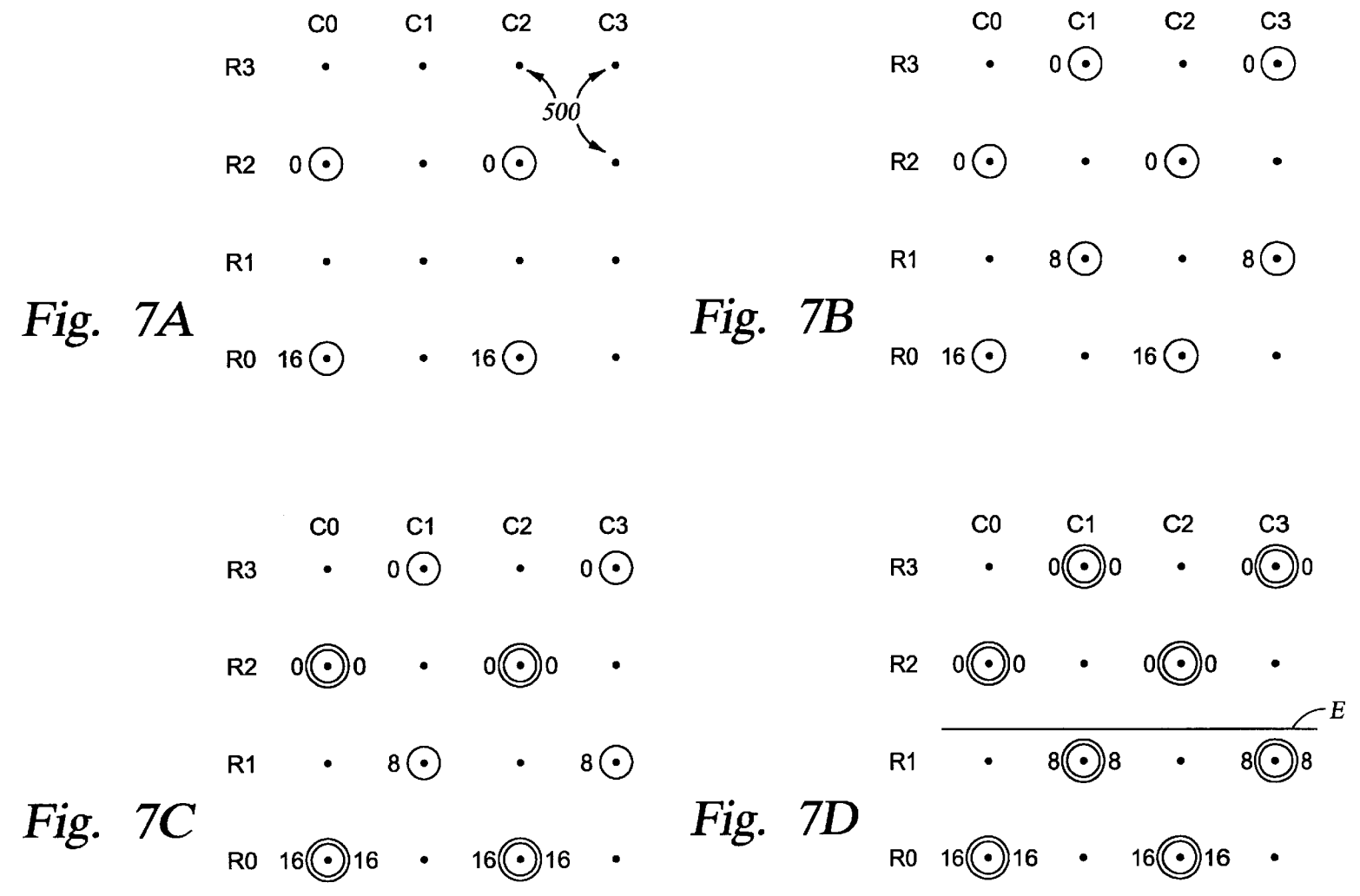

The gray level assignment pattern in FIG. 7A is the same as the one shown in FIG. 5A and represents the first printing pass. In FIG. 7B, however, the second printing pass applies an energy dose associated with gray level 8 to (R1,C1) and (R1,C3), and with gray level 0 to (R3,C1) and (R3,C3). The third and fourth printing passes, respectively illustrated in FIGS. 7C and 7D, each apply an energy dose identical to the doses applied in the first and second printing passes, respectively. Thus edge E is defined between rows R1 and R2.

FIG. 8 is a diagram illustrating a second embodiment of a gray level assignment strategy combined with the printing strategy shown in FIG. 7. FIG. 8A shows the same pattern as FIG. 7D and defines edge $E_0$. In FIG. 8B the gray levels for (R1,C1) and (R1,C3) are incremented to 9 for the second printing pass, and the gray levels for (R2,C0) and (R2,C2) to 1 for the third printing pass. Thus edge $E_1$ is defined one-sixteenth pixel pitch from the edge $E_0$ position. The total energy dose applied to each pixel determines edge placement, and so the order of intensities applied during the printing passes may be reversed.

The sequential incrementing of gray level numbers continues in a manner similar to the one shown for FIGS. 6A–6F. In FIG. 8C (R1,C1) and (R1,C3) receive two doses associated with gray level 9, and (R2,C0) and (R2,C2) receive two doses associated with gray level 1, thus defining edge $E_2$ that is two-sixteenths of a pixel pitch from $E_0$. In FIG. 8D edge $E_3$ is defined by incrementing the gray levels for (R1,C1) and (R1,C3) to 10 for the third pass, and for (R2,C0) and (R2,C0) to 2 for the third pass. The alternating pattern continues until edge $E_{15}$ is defined by gray levels 16 and 15 for (R1,C1) and (R1,C3), and by gray levels 7 and 8 for (R2,C0) and (R2,C2). FIG. 6F shows edge $E_{16}$ defined one pixel pitch higher than E0 by displacing the pattern shown in FIG. 6A upward by one row.

The incremented gray level numbers in the adjacent rows are matched pairs, as illustrated in FIGS. 6A–6F and 8A–8F. That is, when defining an edge using a particular gray level number assigned to a pixel in one row, a matched gray level number is assigned to a pixel in the adjacent row. For example, if gray level 8 is assigned to a row R1 pixel, then gray level 0 is assigned to a row R2 pixel. If gray level 9 is assigned to a row R1 pixel, then gray level 1 is assigned to a row R2 pixel, etc. TABLE I shows one embodiment of matched gray level number pairs for a 17 gray level scheme.

TABLE I

| Edge | Row R1<br>First Pass, Second Pass | Row R2<br>First Pass, Second Pass |
| --- | --- | --- |
| E0 | 8, 8 | 0, 0 |
| E1 | 9, 8 | 1, 0 |
| E2 | 9, 9 | 1, 1 |
| E3 | 10, 9 | 2, 1 |
| E4 | 10, 10 | 2, 2 |
| E5 | 11, 10 | 3, 2 |
| E6 | 11, 11 | 3, 3 |
| E7 | 12, 11 | 4, 3 |
| E8 | 12, 12 | 4, 4 |
| E9 | 13, 12 | 5, 4 |
| E10 | 13, 13 | 5, 4 |
| E11 | 14, 13 | 6, 5 |
| E12 | 14, 14 | 6, 6 |
| E13 | 15, 14 | 7, 6 |
| E14 | 15, 15 | 7, 7 |
| E15 | 16, 15 | 8, 7 |
| E16 | 16, 16 | 8, 8 |

Other embodiments of the invention may use other increasing gray level assignments to define the edge. For example, a single printing pass may be used with 16 possible gray level numbers. In this embodiment, the first edge movement occurs by increasing the gray level assigned to the row R1 pixel from 8 to 9, and increasing the gray level assigned to the row R2 pixel from 0 to 1. The second edge movement occurs by increasing the gray level assigned to the row R1 pixel from 9 to 10, and increasing the gray level assigned to the row R2 pixel from 1 to 2. The simultaneous gray level increases are continued until the edge is moved one address unit. Other embodiments may use other combinations of gray levels and printing passes.

The printing scheme embodiments described are illustrative. Embodiments of the invention may be used with other sampling and pixel center schemes in which pixels in more than one row have intermediate gray levels. For example, embodiments may be applied to an eight-exposure scheme that interlaces eight pixel centers such that pixels in 3 or 4 rows along an edge to be defined have intermediate gray levels if there are two exposure rows of pixels on each row, or in 7 or 8 rows if there is only one row of exposure pixels per row (the latter case occurs if the 8 exposures are interlaced into unique sets of rows per exposure where the exposure row centers of the pixels are centered at different locations).

In one embodiment the coded instructions executed by geometry engines 38 (FIG. 4) are unchanged. For example, the ALTA 3000 and 3500 systems use hard coded instructions in an application specific integrated circuit (ASIC). But embodiments may use software instructions as well. Only selected software rasterization parameters 42 are changed to produce the above described gray level number assignments. The rasterization software changes are easily accomplished by persons skilled in the art in light of this disclosure.

Gray Level Intensities

Each unique rasterized gray level number as described above is matched with a unique energy beam intensity. Unlike conventional printing processes, the ordered set of beam intensity values is non-linear and non-monotonic with respect to the gray level numbers. For example, there may be a larger intensity increase associated with a change from gray level numbers 2 to 3 than from gray level numbers 1 to 2. And, there may be an intensity decrease associated with a change form gray level 15 to 16.

Figure 9:
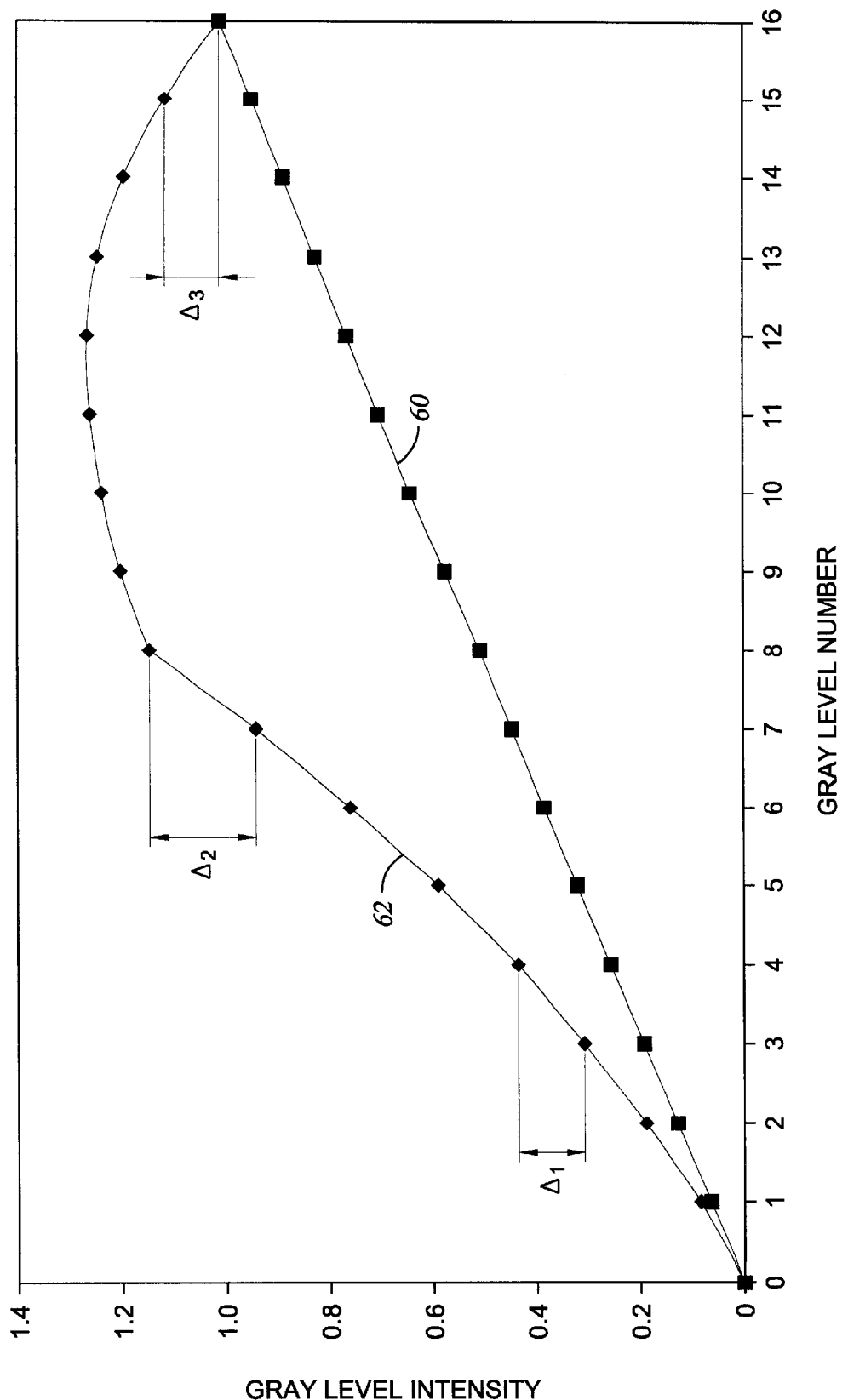
FIG. 9 is a graph plotting normalized gray level energy beam intensities against sixteen gray level numbers in accordance with one embodiment of the invention.

FIG. 9 is a graph plotting normalized gray level intensities (vertical scale) against sixteen gray level numbers. In the figure, 1.0 (level 16 in this embodiment) represents two times the dose to clear the center of a large written area. (The normalized 1.0 value need not be associated with the maximum, or any particular gray level number.) The squares plotted on curve 60 represent conventional linearly increasing intensities matched with each gray level number. For example, the energy change between the intensities matched with gray level numbers 1 and 2 is the same as the energy change between the intensities matched with gray level numbers 2 and 3. In contrast, the diamonds plotted on curve 62 illustrate one set of non-linear, non-monotonic intensities matched in accordance with the invention to gray level numbers. The gray levels plotted on curve 62 are optimized only to make subpixel linearity (described below) perfect. Other embodiments use other non-linear, non-monotonic intensity sets that are optimized for other parameters. As shown, the associated beam intensities rapidly rise from gray level numbers 0 to 8, rise more slowly from gray level number 8 to 12, and then decrease from gray level numbers 12 to 16. For example, the energy difference $\Delta_1$ between intensities matched with gray level numbers 3 and 4 is not equal to the energy difference $\Delta_2$ between intensities matched with gray level numbers 7 and 8. Note that several intensities (e.g., for gray level numbers 8–15) are above the 1.0 normalized value.

The intensities matching the gray level numbers as shown in FIG. 9 may be used with the FIG. 6 or FIG. 8 rasterization assignments. For example, consider the edge position change illustrated between FIGS. 6C and 6D. Pixels (R1,C0) and (R1,C2) receive a proportionally smaller dosage increase (associated with changing gray level 9 to 10) than the dosage increase received by (R2,C1) and (R2,C3) (associated with changing gray level 1 to 2). As another example, for the edge position change between FIGS. 6E and 6F, (R2,C0) and (R2,C2) receive a large dosage increase ($\Delta_2$, FIG. 9), while the dose to (R1,C1) and (R1,C3) is reduced ($\Delta_3$, FIG. 9). The writing strategy illustrated by FIGS. 8A–8F uses a similar approach, but one in which the pixels receive a total energy dose after multiple exposures.

Embodiments such as those described above provide several advantages over conventional gray level printing schemes. The beam intensities matched with each gray level number may be set so that a selected printing parameter (e.g., edge placement linearity or CD linearity) is optimized. In one embodiment the beam intensities are optimized to provide an improved edge slope at each incremental edge position. Persons familiar with lithography will understand that conventional data sizing is used to compensate for edge displacement that results from higher total exposure energy near the edge being printed. In another embodiment the beam intensities are optimized to minimize the edge placement error for each incremental edge position. In yet another embodiment the beam intensities are optimized to provide improved line width linearity error for submicron line widths. That is, for submicron (less than approximately 0.50 μm) line widths, the difference between target and printed line widths is improved to be nearly constant. Again, persons familiar with lithography will understand that conventional data sizing is used to compensate for the beam intensities used in accordance with this embodiment of the invention. Other parameters that may be optimized are corner acuity or linearity error in small squares rather than in lines.

Figure 10:
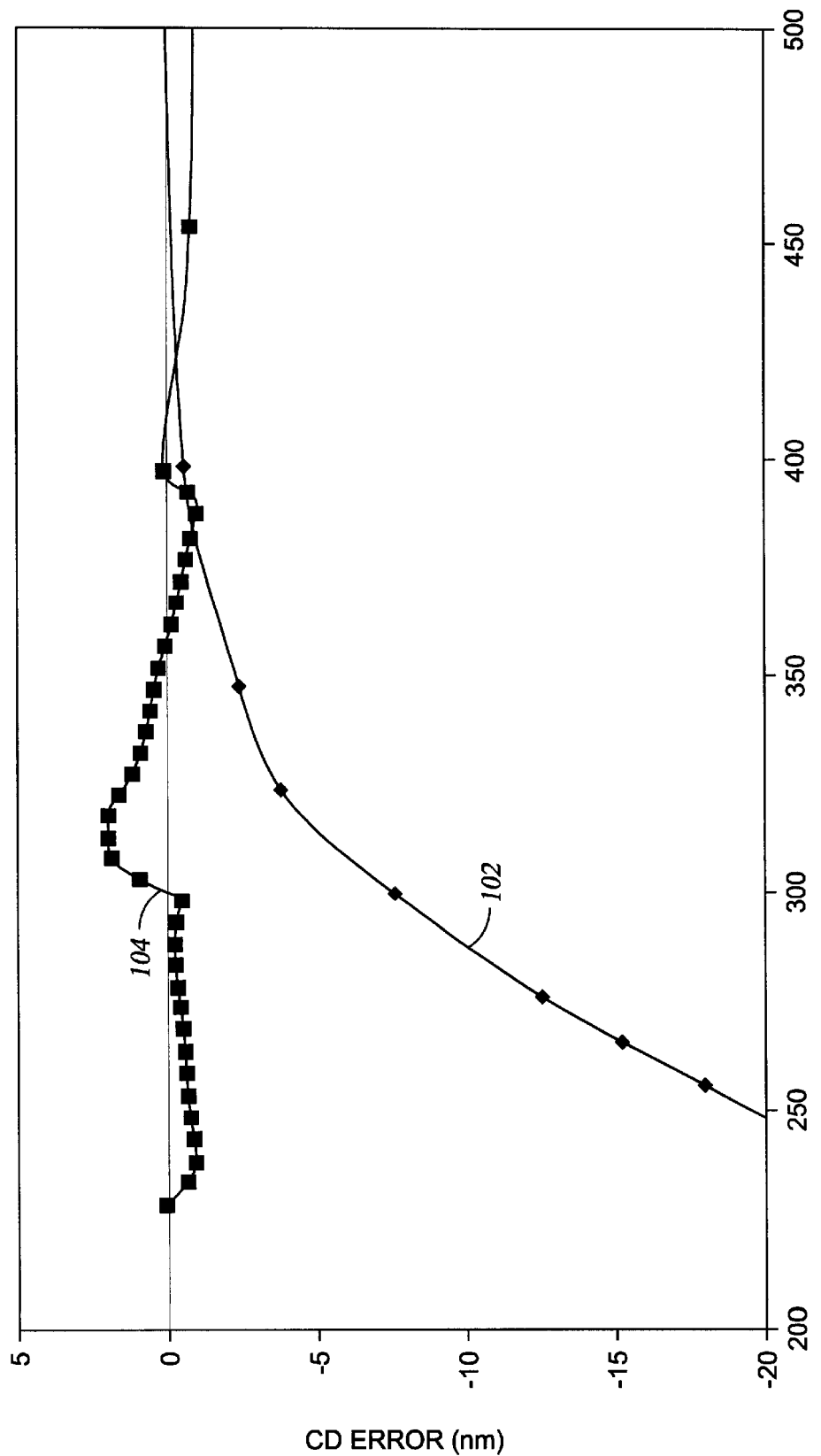
FIG. 10 is a chart plotting critical dimension error versus target critical dimension.

FIG. 10 is a chart plotting CD error versus target CD, both expressed in nanometers. Line 102, defined by the diamonds, represents a baseline plot using a conventional ALTA 3500 printing strategy that shows a significantly increasing CD error as target CD is reduced. Line 104, defined by the squares, represents a plot using an embodiment optimized for CD linearity. As shown, the CD error in line 104 remains small as target CD is reduced. The line 104 plot is based on modeling.

Figure 11:
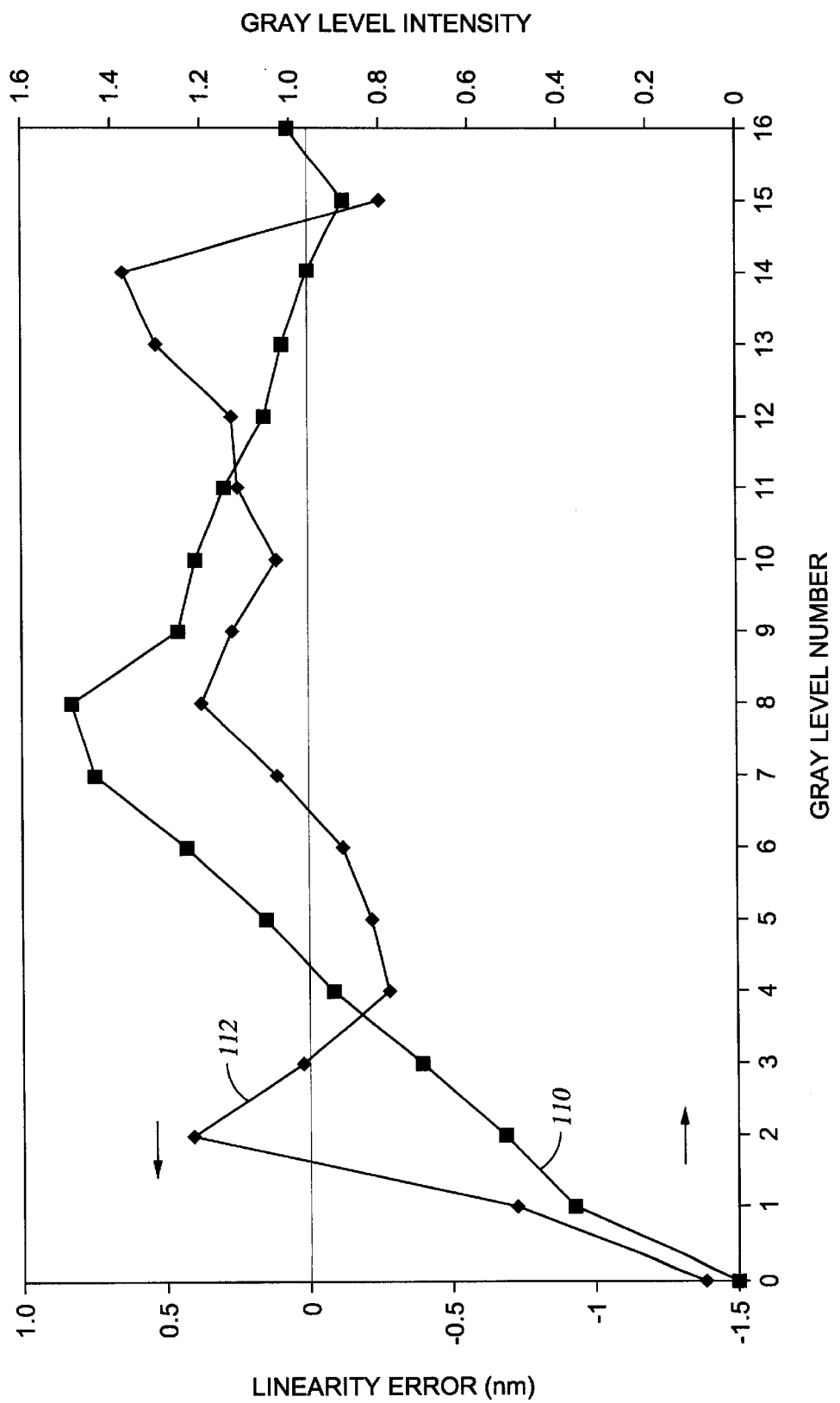
FIG. 11 is a chart plotting linearity error versus gray level for one embodiment.

FIG. 11 is a chart plotting subpixel linearity error and beam intensity versus gray level for an embodiment. Subpixel linearity represents the variation from the ideal edge movement due to the use of gray levels. For example, $E_1-E_2$ as shown in FIG. 6 should be exactly $\frac{1}{16}$ of the pixel spacing. The linearity error is the deviation from this ideal spacing. The squares plotted along line 110, read against the right side vertical scale, show the gray level intensity settings on a normalized intensity scale as described above for FIG. 9. The diamonds plotted along line 112, read against the left side vertical scale, show linearity error in nanometers for each gray level. The gray levels plotted along curve 110 are optimized to make both CD linearity and subpixel linearity as good as possible.

Figure 12:
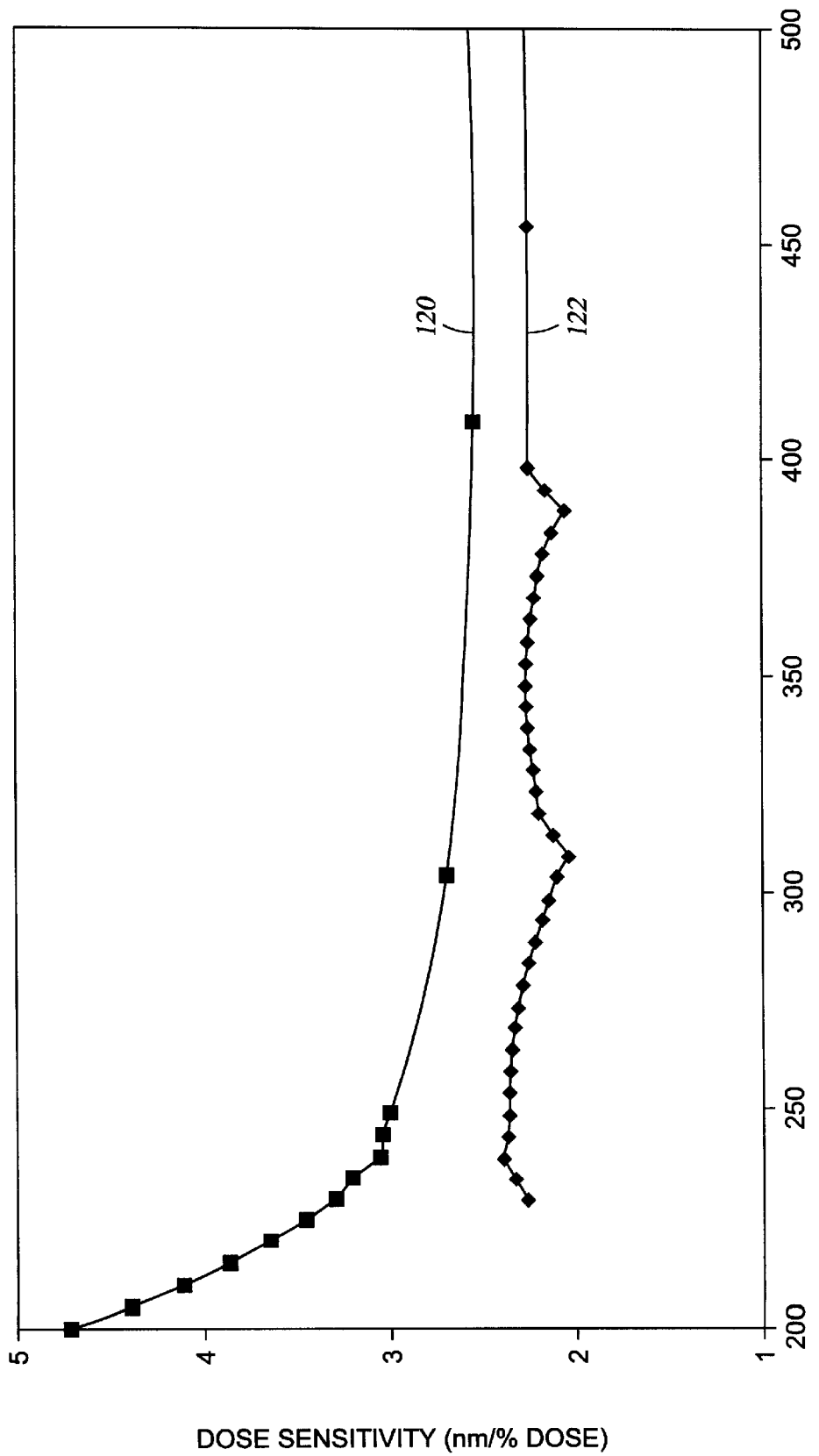
FIG. 12 is a chart plotting energy dose sensitivity per edge versus target critical dimension.

FIG. 12 is a chart plotting energy dose sensitivity in nanometers per percent dose (nm/%dose) versus target CD expressed in nanometers. Dose sensitivity is the rate at which CD changes due to changes in dose. For good CD control, a small value is desired so that variations in dose caused by limitations of the machine cause small CD changes. This chart demonstrates that an embodiment significantly improves CD control when printing small features. Line 120, defined by the squares, represents a baseline plot using a conventional ALTA 3500 printing strategy that shows a significantly increasing dose sensitivity as target CD is reduced. Line 122, defined by the diamonds, represents a plot using an embodiment optimized for dose sensitivity. As shown, the dose sensitivity shown by line 122 remains small as target CD is reduced. These plots are based on modeling.

Figure 4:
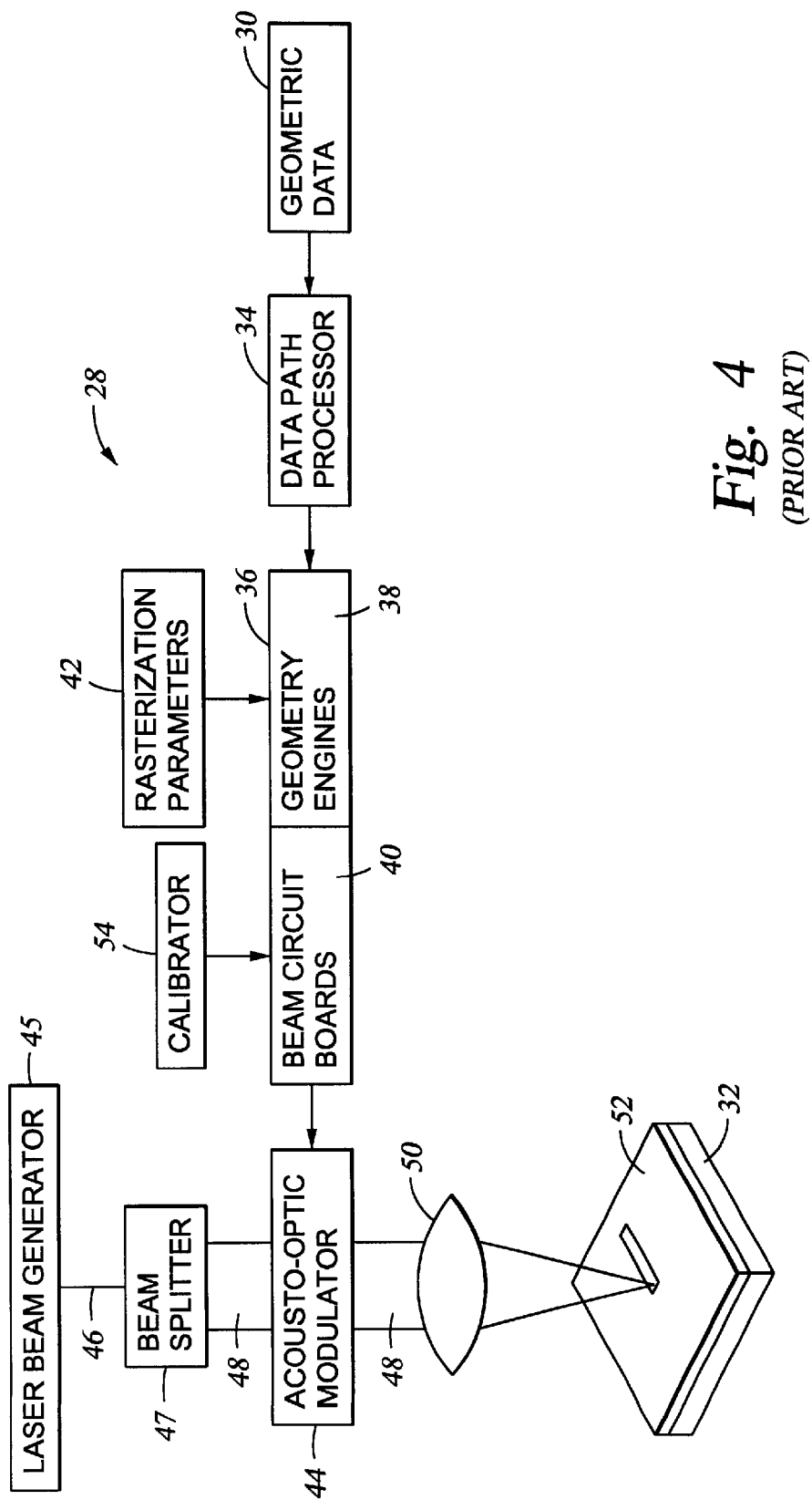
FIG. 4 is a block diagram showing data path components of a conventional lithography tool.

In one embodiment the invention is implemented on an ALTA 3500. Referring to FIG. 4, the invention is implemented first by maintaining or changing the rasterization parameters 42 input to rasterizer 36. The new rasterizing parameters implement a rasterization scheme in accordance with the invention (e.g., as illustrated in FIGS. 6A–6F and 8A–8F). A programmer normally skilled in the art will understand how to modify the parameters to implement rasterization schemes in accordance with the invention. Second, the invention is implemented by using calibrator 54 to adjust beam intensities matched with each gray level numbers. No changes to the lithography tool circuitry are required, and the rasterization process is unchanged. Removing the conventional restriction that beam intensities increase linearly in proportion to the gray level number allows the lithographic process to be optimized for various results.

TABLE II

| Gray level No. | Intensity |
|---|---|
| 0 | 0 |
| 1 | 0.351 |
| 2 | 0.505 |
| 3 | 0.693 |
| 4 | 0.692 |
| 5 | 1.052 |
| 6 | 1.233 |
| 7 | 1.440 |
| 8 | 1.498 |
| 9 | 1.264 |
| 10 | 1.223 |
| 11 | 1.148 |
| 12 | 1.059 |
| 13 | 1.017 |
| 14 | 0.958 |
| 15 | 0.871 |
| 16 | 1 |

Table II shows gray level intensities in one embodiment. The intensities are plotted in FIG. 11, and FIGS. 10–12 are based on these values. This scheme was obtained by minimizing the CD linearity error, as plotted in FIG. 10, and the subpixel linearity error, as plotted in FIG. 11. The gray level intensities are adjusted to minimize $X^2$ where $$\chi^2 = \sum_{i=1}^{N} w_i (\Delta x_i)^2$$

where $\Delta x_i$ is the error of the $i^{th}$ data point from its ideal value and $w_i$ is the weighting factor for that point. The weighting factor allows more importance to be placed on one or more of the data points. Each $\Delta x_i$ is dependent on the choice of gray levels. For the embodiment shown in Table II, the sixteen calculated subpixel errors shown in FIG. 11 are give a weighting factor of $\frac{1}{16}$. The CD linearity of FIG. 10 includes 41 points (some are not shown) and each point is given a weighting factor of $\frac{1}{41}$. Thus the number of points N in the above equation is 57 for this optimization. A different set of gray levels may be obtained by changing the weighting factors or by including any other chosen criteria. Alternatively, a parameter other than $X^2$ may be used to define a set of desirable gray level intensities. Various methods exist for determining the set of gray level intensities that minimizes $X^2$, and skilled persons will easily accomplish such minimization in light of this disclosure.

The present invention has been described using specific embodiments. Persons skilled in the art will understand, however, that many variations of the invention are possible. For example, many different energy beam intensity levels may be matched with individual gray level numbers. Single or multipass printing schemes using other than 17 gray level numbers may be used. The invention is therefore limited only by the following claims.

We claim:

1. A lithography method comprising:
    defining a first set of linearly increasing gray level numbers;
    defining a second set of energy beam intensities, wherein each intensity in the second set corresponds to a unique gray level number in the first set, and wherein the intensities are non-linear and non-monotonic in relation to the gray level numbers;
    rasterizing geometric shape information to define an array of pixels representing the shape, wherein each pixel in the array is associated with at least one gray level number;

generating an energy beam;

modulating the energy beam to produce the intensity corresponding to the gray level number associated with a selected pixel; and imaging the rasterized shape on an energy sensitive layer overlying a substrate by directing the modulated intensity energy beam onto the sensitive layer.

2. The method of claim 1 wherein the array of pixels comprises a row of pixels, and wherein rasterizing geometric shape information comprises defining an edge by associating at least one intermediate gray level number with a pixel in the row.

3. The method of claim 1 wherein the array of pixels comprises rows of pixels, and wherein rasterizing geometric shape information comprises defining an edge by associating at least one intermediate gray level number with a first pixel in a first row, and by associating at least one intermediate gray level number with a second pixel in a second row.

4. The method of claim 2 wherein an intensity corresponding to a particular intermediate gray level number is greater than an intensity corresponding to a highest gray level number.

5. The method of claim 1 wherein rasterizing comprises associating each pixel with at least two gray level numbers.

6. The method of claim 1 wherein defining the set of energy beam intensities comprises defining the intensities so as to optimize a critical dimension of the shape as imaged in the energy sensitive layer.

7. The method of claim 1 wherein the substrate comprises quartz glass having an overlying layer of chromium, and the energy sensitive layer comprises a photoresist layer overlying the chromium.

8. A lithographic apparatus comprising:

a rasterizing outputting an array of pixels, wherein a geometric shape is defined in the array by associating each pixel in the array with at least one gray level number from a first set of linearly increasing gray level numbers;

a beam generator outputting an energy beam; and a modulator coupled to the rasterizer and positioned to receive at least a portion of the energy beam, wherein the modulator outputs a second energy beam having an intensity selected from a second set of intensities, wherein each intensity in the second set corresponds to a unique gray level number in the first set, and wherein the intensities are non-linear and non-monotonic in relation to the gray level numbers.

9. The apparatus of claim 8, wherein the array comprises a row of pixels, and wherein the rasterizer defines an edge of the shape by associating at least one intermediate gray level number with a pixel in the row.

10. The apparatus of claim 8, wherein the array comprises rows of pixels, and wherein the rasterizer defines an edge of the shape by associating at least one intermediate gray level number with a first pixel in a first row, and by associating at least one intermediate gray level number with a second pixel in a second row.

11. The apparatus of claim 8, wherein an intensity corresponding to a particular intermediate gray level number is greater than an intensity corresponding to a highest gray level number.

12. The apparatus of claim 8, wherein the rasterizer defines the geometric shape so that each pixel in the array is associated with at least two gray level numbers.

13. The apparatus of claim 8, wherein the intensities in the second set are selected so as to optimize a critical dimension of the shape as imaged in an energy sensitive layer overlying a substrate.

* * * * *